United States Patent [19]

Acharya et al.

[11] Patent Number: 4,815,118
[45] Date of Patent: Mar. 21, 1989

[54] DATA CONVERTER FOR CT DATA ACQUISITION SYSTEM

[75] Inventors: Kishore C. Acharya, Brookfield; Paul C. Schanen, Waukesha, both of Wis.

[73] Assignee: General Electric Company, Milwaukee, Wis.

[21] Appl. No.: 66,987

[22] Filed: Jun. 29, 1987

[51] Int. Cl.[4] .............................................. A61B 6/00
[52] U.S. Cl. ......................................... 378/19; 378/4; 330/284
[58] Field of Search ...................... 378/19, 4; 330/144, 330/284, 51, 9

[56] References Cited

U.S. PATENT DOCUMENTS

| 3,464,022 | 8/1969 | Locheed, Jr. et al. | 330/144 |
| 3,810,031 | 5/1974 | Poujois | 330/9 |
| 4,220,860 | 9/1980 | Carlson et al. | 378/19 X |
| 4,278,889 | 7/1981 | Erker | 378/19 |
| 4,292,596 | 9/1981 | Ishizuka et al. | 330/284 X |
| 4,356,450 | 10/1982 | Masuda | 330/9 |
| 4,377,868 | 3/1983 | Mueller | 378/19 |
| 4,484,340 | 11/1984 | Yamaguchi et al. | 378/19 |
| 4,565,971 | 1/1986 | Brookshire | 330/9 |
| 4,667,153 | 5/1987 | Doyle | 330/9 X |
| 4,697,280 | 9/1987 | Zarnstorff et al. | 378/19 X |

FOREIGN PATENT DOCUMENTS 0163905  9/1984  Japan ............................... 330/284

Primary Examiner—Eugene R. LaRoche
Assistant Examiner—Seung Ham
Attorney, Agent, or Firm—James H. Beusse

[57] ABSTRACT

Improved data converter circuitry for a CT data acquisition system is disclosed which makes use of a programmable gain amplifier whose gain is set according to the magnitude of a detector input signal by selecting one of several resistor voltage-divider paths at the input of a fixed gain amplifier. An auto-zero loop uses an intergrating op-amp to provide periodic correction to offset voltage of the fixed gain amplifier. In a modified embodiment, an auto-zero loop is provided for correction of both the fixed gain amplifier and a serially-connected A/D converter.

15 Claims, 3 Drawing Sheets

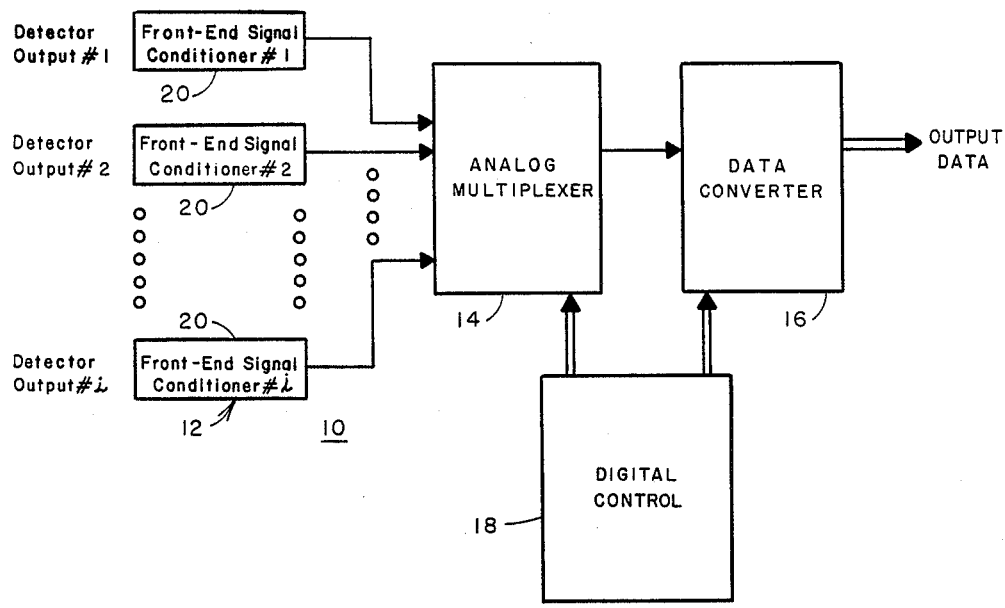
FIG. 1
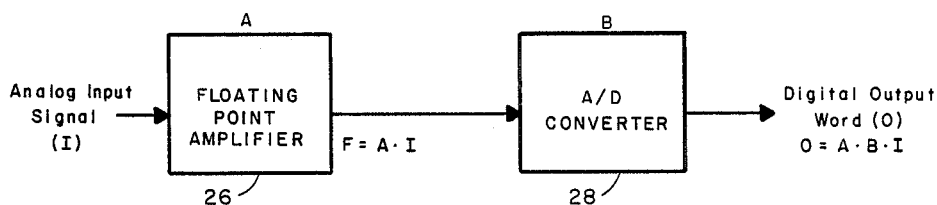
FIG. 2
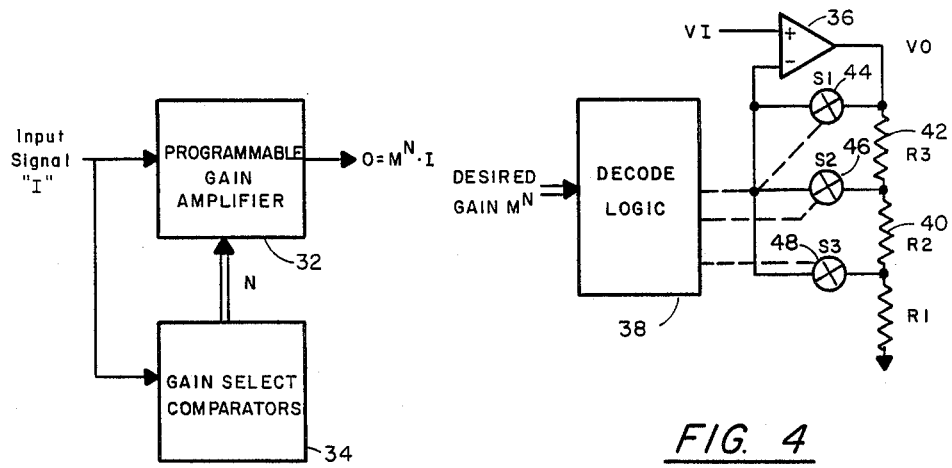
FIG. 3
FIG. 4
(PRIOR ART)

4,815,118

DATA CONVERTER FOR CT DATA ACQUISITION SYSTEM

This invention relates to improved data converter circuitry for use in a computerized tomography (CT) or similar radiation imaging data acquisition system.

BACKGROUND OF THE INVENTION

Computerized tomography equipment, such as CT scanning apparatus, is widely used as a diagnostic tool for analyzing the internal profile of an object under study, such as for the medical diagnosis of a human body organ. Such equipment can provide a two or three-dimensional composite "picture" of the object by analyzing a plurality of radiation images taken of the object at different orientations. A usual source of imaging radiation is a source of X-rays located on one side of the object, with the images being developed by one or more X-ray detectors located on the opposite side of the object, whose signal outputs are converted into digital signals which are analyzed by computer.

The CT data acquisition system receives the output from the detectors, and, under digital control to correlate a particular signal with a particular orientation, conditions, amplifies and converts the detector output signals into useful digital data form suitable for subsequent analysis.

Typical data acquisition circuitry has four main components: a front-end signal conditioner, an analog signal multiplexer, a data converter, and a digital control. The front-end signal conditioner serves to convert relatively low level analog signals from the detectors into low output impedance signals for the rest of the acquisition system. Normally, each detector channel or line has at least some dedicated signal conditioning circuitry associated with it. The function of the multiplexer is to take the signals from the different detector channels and enable them to be processed (in time-sharing fashion) along common channels, thereby reducing the number of components needed in the follow-on circuitry. The analog output of the multiplexer is fed into a data converter to transform the analog signals into corresponding digital signal information appropriately converted to digital form. The whole process operates under the direction of the digital control circuitry.

The data acquisition circuitry of conventional high performance CT systems utilizes more than one data converter because of the combined sampling rate and accuracy requirements. The data converter is often comprised of two primary elements, a floating point amplifier and an analog-to-digital (A/D) converter. To ensure that the input to the A/D converter is always greater than some minimum value, the floating point amplifier operates to provide greater amplification for smaller magnitude input signals, with the amount of amplification given to a particular signal being selected as a function of the magnitude of the input signal.

One approach to previous data conversion circuitry (discussed further below in reference to FIG. 4) utilizes a programmable or selectable gain amplifier in which gain is set by changing the feedback path through switching the point of connection to a plurality of resistors connected in series between input and output terminals of the amplifier. Because this approach achieves different gains by varying the feedback resistance of the same amplifier, the settling times are long and different for each gain selection. Also, implementation of an offset drift correction (auto-zero) capability is complicated and cumbersome, as each gain configuration requires a different amount of offset or offset value. Furthermore, gain adjustment is complicated because the same resistors affect more than one gain selection.

A second approach (discussed later in reference to FIG. 5) utilizes a plurality of amplifiers in parallel, each configured for a different single gain setting, and means for selecting which one of the amplify paths will be used to amplifier a given signal. This approach is faster than the first approach but requires a different amplifier, with a corresponding different settling time, for each gain setting. Also, because separate amplifier configurations are used, each gain setting will require its own auto-zero setting circuitry for offset voltage correction.

SUMMARY OF THE INVENTION

The present invention provides an improved data converter for a CT data acquisition system comprising programmable gain amplifier circuitry having a switchable resistor attenuator stage followed by a fixed amplifier stage, with gain being selected by varying the configuration of the resistor attenuator stage. Such circuitry has the advantages of giving a single settling time independent of gain setting and enabling the simple implementation of an auto-zero feature. It also offers the capability for later addition or modification of available gain selections, without the need to change or add amplifiers. In a preferred embodiment, described in detail below, reduced settling time is attained by using more than one amplifier to make up the fixed amplifier stage.

BRIEF DESCRIPTION OF THE DRAWINGS

Embodiments of the invention have been chosen for purposes of illustration and description, and are shown in the accompanying drawings, wherein:

FIG. 1 is a block diagram of a CT data acquisition system of the type to which the present invention finds application;

FIG. 2 is a block diagram of a data converter usable in the system of FIG. 1;

FIG. 3 is a block diagram for the floating point amplifier of FIG. 2;

FIG. 4 is a simplified schematic diagram of a first prior art approach to the programmable gain amplifier of FIG. 3;

Throughout the drawings, like elements are referred to by like numerals.

DESCRIPTION OF THE PREFERRED EMBODIMENTS

Figure 5:
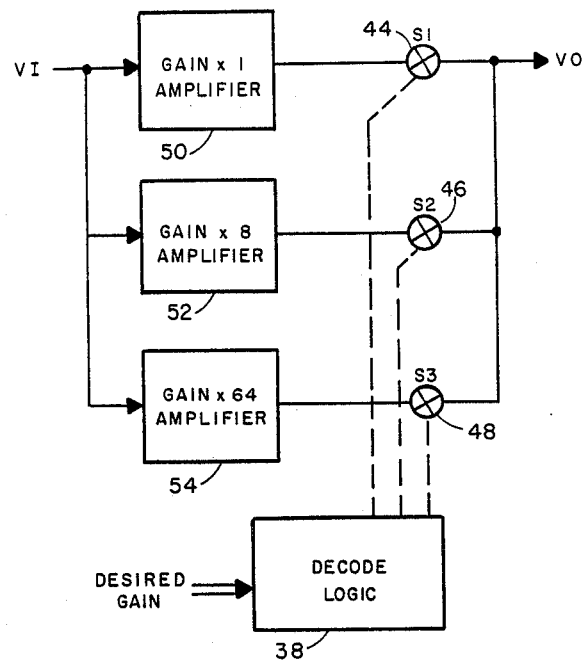
FIG. 5 is a schematic diagram of a second prior art approach to the programmable gain amplifier of FIG. 3.

A simplified block diagram for a CT data acquisition system 10 of the type to which the present invention finds application is shown in FIG. 1. The system 10 has four primary elements: a front-end signal conditioner 12, an analog multiplexer 14, a data converter 16 and a digital control 18.

The front-end signal conditioner 12 receives relatively low-level analog output signals from a plurality of X-ray detectors 1 through i (not shown) and converts them to low output impedance signals for further processing by the rest of the data acquisition system 10. Each detector output channel or line 1 through i (FIG. 1) has at least some dedicated signal conditioning circuitry 20. After processing by the front-end signal conditioner 12, the analog signals from the separate detector channels are passed to the analog multiplexer 14 where they are multiplexed to enable further processing in time-shared fashion by follow-on data conversion circuitry 16. The data converter 16 transforms the analog signals into correspondingly-valued digital word signals. The multiplexing and data conversion process operates under the direction of the digital control circuitry 18 which maintains the information correlation between the signals and their respective detector position origins.

Traditionally, high performance CT data acquisition systems 10 have utilized more than one data converter 16 to achieve the desired sampling rate and accuracy requirements. With the data converter 16 in accordance with the invention, however, the number of required data converters 16 can be significantly reduced so that even a relatively high performance CT data acquisition system can be implemented using only a single data converter 16.

The data converter 16 is composed of two primary components, as shown in FIG. 2: a floating point amplifier 26 and an analog-to-digital (A/D) converter 28. For an input signal "I" and transfer functions "A" and "B" of the floating point amplifier 26 and A/D converter 28, respectively, the digital output word signal "O" of the data converter 16 can be represented by the equation: O=I A B. In general, the transfer function of the floating point amplifier 28 is of the form $M^N$, where "N" is an integer whose value increases for smaller values of analog input signals, and "M" is usually 2 or integer powers of 2, i.e., 4, 8, 16, etc. The floating point amplifier 26 functions so that "N" is dynamically selected as a function of its analog input signal and the output gain of amplifier 26 is varied so that the input to the A/D converter 28 is always greater than some minimum value, thereby limiting by the size of "M" the number of zero value most significant bits delivered by the A/D converter 28 for subsequent image analysis. This ensures that the resolution as a percentage of reading for the combined amplifier 26-converter 28 combination will be relatively independent of the input signal value, a desired characteristic for a CT data acquisition system.

A simplified block diagram of the floating point amplifier 26 is shown in FIG. 3. The amplifier 26 includes a programmable or selectable gain amplifier 32 and a gain select comparator circuit 34 used to select the gain by establishing the value of the $M^N$ transfer function, described.

A prior art implementation of the programmable gain amplifier 32 and gain select circuitry 36, shown in FIG. 4, utilizes an operational amplifier (op-amp) 36, whose noninverting input is connected to receive the analog signal from the multiplexer 14 and whose inverting input is connected through a feedback path to the output. The feedback path includes a plurality of serially connected resistors and the desired gain $M^N$ is established by means of a decode logic circuit 38 which controls a plurality of switches to connect or disconnect one or more of the resistors from the feedback path.

The prior art arrangement shown in FIG. 4 is for the case of three selectable different gain values. The feedback path includes the resistors 40 and 42 and the decode logic 38 controls the switches 44, 46 and 48 to determine which of the resistors 40 and 42 will be connected across the op-amp 36. Gain of the op-amp 36 is proportional to the feedback resistance divided by the input resistance. So, selectively closing one of the switches 44, 46 and 48 will vary the feedback-to-input resistance relationship giving low (switch 44 closed), medium (switch 46 closed) and high (switch 48 closed) dynamic control gain settings. Because of the constantly changing feedback constituent and usage of the same resistors, as noted previously, the approach of FIG. 4 has settling time delays as well as auto-zeroing and gain adjustment problems.

FIG. 5 illustrates another prior art implementation of the programmable gain amplifier 32 of FIG. 3. In this arrangement, a plurality of different fixed gain amplifiers are connected in parallel across the input and output terminals of the circuit 32, with a switch connected in each parallel path for choosing gain by activating one of the switches. The set up of FIG. 5 has three fixed gain amplifiers 50, 52 and 54 having gains of 1, 8 and 64, respectively. The closing of switch 44 in response to decode logic 38 gives a gain of 1, the closing of switch 46 gives a gain of 8, and the closing of switch 48 gives a gain of 64. The approach of FIG. 5 is faster than that of FIG. 4 but a separate fixed gain op-amp is required for each gain, with separate zero-setting requirements and separate settling time.

Figure 6:
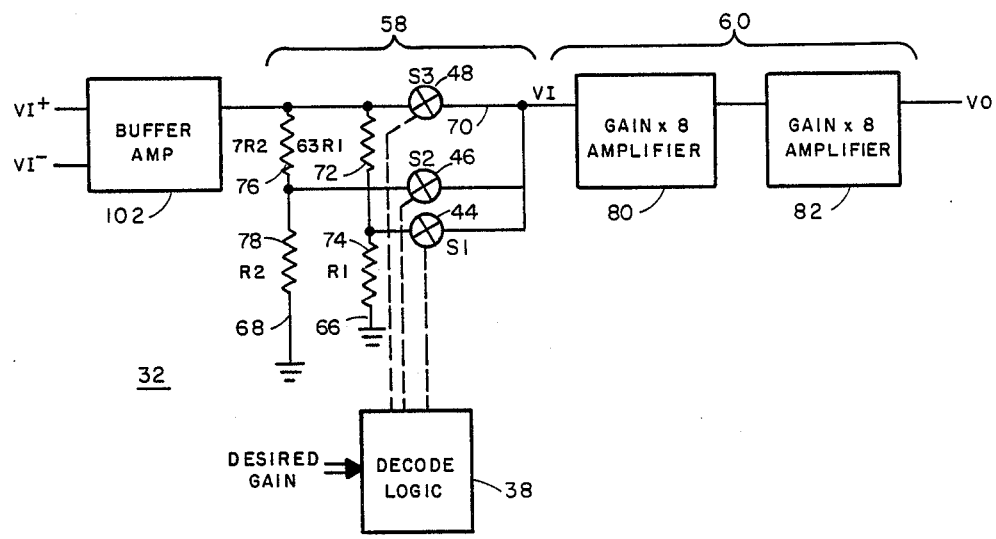
FIG. 6 is a schematic diagram of a programmable gain amplifier in accordance with the principles of the invention.

The improved data converter 16 of the present invention makes use of a programmable gain amplifier 32, as shown in FIG. 6, which has a switchable attenuator stage 58 followed by a fixed gain amplifier stage 60. The attenuator stage 58 takes the form of a plurality of voltage divider paths at the input of the data converter 16 to selectively divide the voltage of the analog input signal I (FIG. 2) prior to input to the fixed gain amplifier stage 60.

For exemplary purposes, a programmable gain amplifier 32 having three attenuator stage 58 paths 66, 68 and 70 providing three selectable gains of 1, 8 and 64 amplification, respectively, is shown. Path 66 has two resistors 72 and 74 serially connected between the input terminal of data converter 16 and ground. The switch 44 is connected to selectivley couple the junction between resistors 72 and 74 to the input of the fixed gain amplifier stage 60 in response to signals from the decode logic 38. The values of resistors 72 and 74 are chosen to provide the desired voltage division or attenuation to the incoming analog signal I (see FIG. 2) to set the overall gain to be provided by the circuit 32. In the example shown, the resistance of resistor 72 is chosen 63 times greater than that of resistor 74. Thus, the voltage across resistor 74 will be R1/(R1+63R1) or 1/64th of the total voltage across the serially connected resistors 72 and 74, and the attenuator input signal VI' delivered to the fixed gain amplifier stage 60 when switch 44 is closed will have a voltage of 1/64th the magnitude of the initial input signal VI+ or VI−. For a fixed gain amplifier stage 60 of fixed gain of 64 as shown, with selection of the input attenuation path 66 will result in an output signal VO of the circuit 32 equal to (VI/64) 64, or VI, thereby providing an overall gain of 1.

Similarly, path 68 has two resistors 76 and 78 serially connected between the input terminal of data converter 16 and ground; and switch 46 is connected to selectively couple the junction of resistors 76 and 78 to the input of the amplifier stage 60. The resistance value of resistor 76 is chosen seven times greater than the resistance value of resistor 78, so that when switch 46 is closed a signal VI' having ⅛th the magnitude of the initial input signal VI will be applied to the fixed 64 gain amplifier stage 60, thereby resulting in an output signal VO of (VI/8) 64, or 8 VI, giving an overall circuit 32 gain of 8.

Path 70 is shown providing a direct connection through switch 48 between the input terminal of the data converter 16 and the input of the amplifier stage 60. This is the equivalent of having a voltage divider path 70 with a resistance of approximately zero ohms serially connected to a resistance of some value, as for example, 64R1 (the sum of the resistances of resistors 72 and 74). When switch 48 is closed, a signal of voltage value VI'=64R1(64R1+0)VI=VI (i.e. unattenuated) will be delivered to the input of stage 60, where it will be amplified to provide an overall circuit 32 gain of 64.

In operation, the programmable gain amplifier 32 of FIG. 6 serves to provide a dynamic gain selection of 1, 8 or 64 gain amplification in response to the exclusive switch setting established by the decode logic circuit 38 from a desired gain signal established in accordance with well-known techniques by gain selection circuitry 34(FIG. 3). A detector output #1 signal (FIG. 1) of low magnitude $VI_1$, for example, delivered after conditioning by dedicated front-end signal conditioner #1 circuitry 20 and multiplexing by the analog multiplexer 14 to the input of the programmable gain amplifier 32, will be subjected to amplification at the high gain setting (gain of 64) by the selective closing of switch 48 (FIG. 6) (the other switches being open). With switch 48 closed, the low magnitude input signal $VI_1$ will be passed unattenuated through the resistor attenuator stage 58 to the programmable gain amplifier 60, where it will be amplified by a factor of 64 to give an output signal $VO_1 = 64\ VI_1$ for analog-to-digital conversion by the A/D converter 28 (FIG. 2) to form a digital output word for subsequent analysis. A detector output #2 signal (FIG. 1) of medium magnitude $VI_2$ will elicit a medium gain setting in the programmable gain amplifier 32 (FIG. 6). Decode logic 38 will direct the closing of switch 46 (switches 44 and 48 being open) so that a signal $VI_2'$ of magnitude equal to R2/(R2+7R2)=⅛th of the magnitude of $VI_2$ will be amplified by the fixed gain amplifier stage 60 of gain 64, to give an output signal $VO_2 = 8\ VI_2$ for conversion by the A/D converter 28 (FIG. 2). Similarly, a detector output #3 signal (FIG. 1) of high magnitude $VI_3$ will be subjected to a low gain setting of the programmable gain amplifier 32 by the closing of switch 44 (switches 46 and 48 open) which will deliver a signal $VI_3'$ of magnitude R1/(R1+63R1)=1/64th magnitude of $VI_3$ to the stage 60 for 64 times amplification, resulting in an output signal $VO_3 = 64\ VI_3$ for A/D conversion and subsequent processing.

The use of a variable attenuation input stage 58 and a fixed gain amplifier stage 60, as described, offers significant advantages over the prior art programmable gain amplifier configurations shown in FIGS. 4 and 5. Unlike the prior art structures, the circuitry 32 of FIG. 6 exhibits a settling time independent of the desired gain. While the example implementation of FIG. 6 has only three gain settings 1, 8 and 64, it will be appreciated that, unlike in the prior art arrangements, the gain settings can be easily varied by changing the attenuation path resistance ratios, and that additional gain settings can be provided by simply adding more resistor attenuator paths and corresponding gain select switches, all without making any op-amp changes whatsoever.

The fixed gain amplifier stage 60 of the programmable gain amplifier circuitry 32 may be constituted by one or more serially connected op-amps 80, 82 (FIG. 6). The total fixed amplification of the circuit 60 is coordinated with the different attenuation paths 66, 68, 70 of the attenuator stage 58 to provide the overall desired gain selections. For the fixed 64 gain amplifier stage 60 shown, the use of two serially-connected 8 gain op-amps 80, 82 rather than a single 64 gain op-amp is preferred because of the lower overall settling time thereby achieved. As already noted, the addition of further gain settings in stage 58 will not influence the settling time of stage 60.

Figure 7:
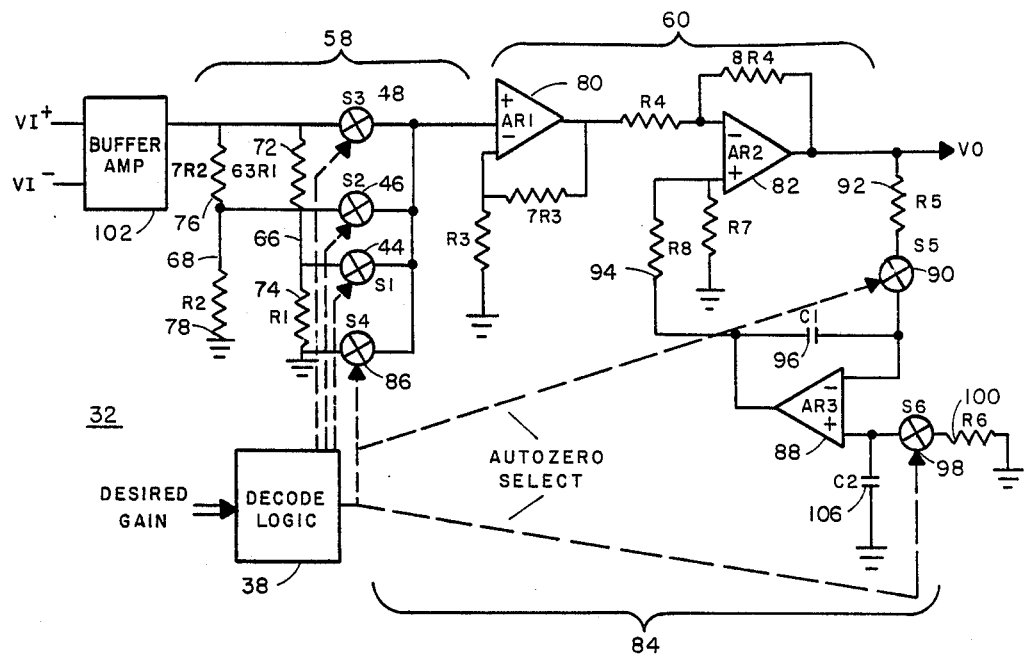
FIG. 7 is a schematic diagram of the programmable gain amplifier of FIG. 6 including an auto-zero offset voltage correction feature.

Another significant advantage offered by the programmable gain amplifier 32 of FIG. 6 is that an autozeroing circuit 84 for automatic adjustment of the voltage offset setting can be easily added to the output stage, as shown in FIG. 7 which gives a more detailed schematic of the two output amplifiers 80 and 82 of FIG. 6. The input offset voltage for an op-amp is defined as the differential input voltage that must be applied across the inputs of the op-amp in order to make the output voltage zero. In the offset voltage adjustment circuit 84 shown in FIG. 7, a fourth switch 86 is provided in the attenuator stage 58 to enable selective connection of the input of op-amp 80 to ground. A third op-amp 88 is connected in integrator configuration across op-amp 82, as shown. The inverting input terminal of op-amp 88 is connected by means of a switch 90 and a resistor 92 to the output terminal of op-amp 82, and the output terminal of op-amp 88 is connected through a resistor 94 to the noninverting terminal of op-amp 82. A capacitor 96 extends in parallel with the op-amp 88 between its inverting input terminal and output terminal. The noninverting input terminal of the op-amp 88 is connected through a switch 98 and a resistor 100 coupling, and also through a capacitor 106, to ground.

During normal operation (not auto-zeroing) switches 86, 90 and 98 are open and switches 44, 46 and 48 are used under the direction of the decode logic 38 to select the desired gain for a particular input signal. The output integrating amplifier 88 is used to hold and supply an offset correction value. The required auto-zero value is established during an intermittent duty cycle auto-zero interval. During the auto-zero interval, switches 44, 46 and 48 are opened and switches 86, 90 and 98 are closed. Current will flow until voltage is built up across the capacitor 96 to give the required input offset voltage correction at the noninverting input of the op-amp 82.

It may be beneficial to provide an optional input buffer amplifier 102 in the circuitry 32, as shown in FIGS. 6 and 7. If this is done, a second auto-zeroing loop (not shown) may be added, using the same principles described above with reference to circuitry 84. It is advantageous to have a separate auto-zero loop for the input buffer amplifier 102 rather than to use the output auto-zero circuit 84 to also correct the offset of the buffer 102. The output auto-zero circuitry 84 can only correct for the offset of the buffer amplifier 102 as it appears at the output of the variable attenuator 58.

Thus, a different offset value would be required for each gain setting. However, if a second auto-zero loop is provided just for the buffer op-amp 102, the benefit of requiring only one offset value for all gain values can be retained.

Figure 8:
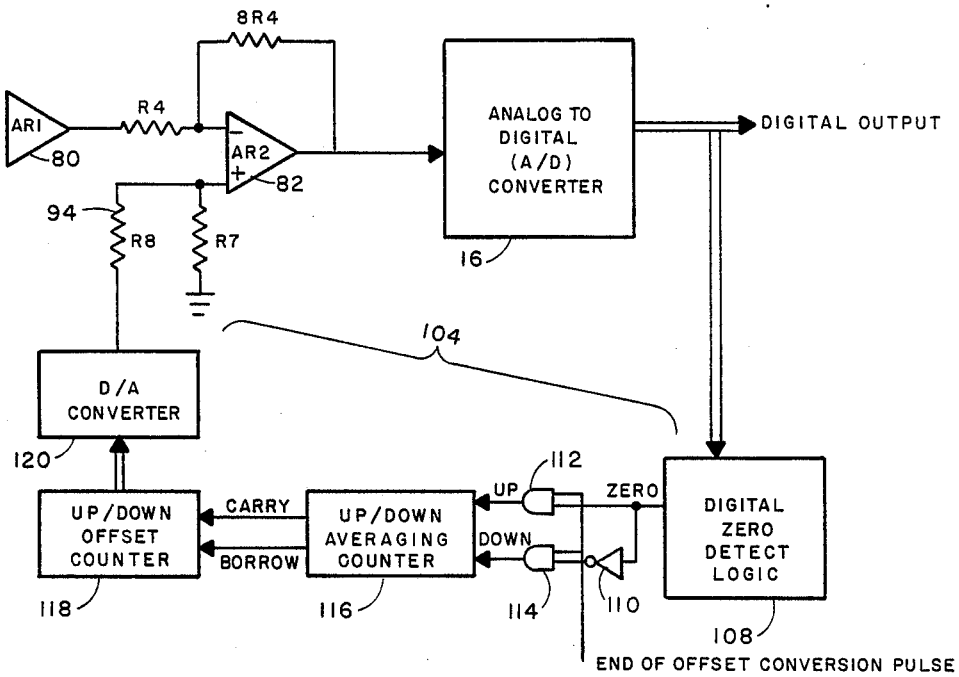
FIG. 8 is a schematic diagram as in FIG. 7 showing a modified auto-zeroing feature.

As discussed with reference to FIG. 2, the data converter 16 (FIG. 1) employs an A/D converter 28 in conjunction with the floating point amplifier 26. Prior art approaches in which each gain setting required a different offset voltage correction value, use a separate auto-zero circuit for zero correction of the A/D converter. As shown in FIG. 8, however, in accordance with the principles of the present invention, the output loop of FIG. 7 can be modified to also provide correction for the offset of the A/D converter 28, thereby eliminating the need for a separate auto-zero circuit for that purpose.

The combined auto-zero circuitry 104 eliminates the need for the op-amp 88, switches 90 and 98, capacitor 96, resistor 100 and capacitor 106 of circuit 84 of FIG. 7. All other components remain and the further components shown in FIG. 8 are added. A digital zero detect logic circuit 108 is connected to receive the output of the A/D converter 16. The output of the zero detect circuit 108 is connected by means of inverter 110 and AND-gates 112, 114 to pulse either up or down an up/down averaging counter 116 upon receipt of an offset setting mode signal. The counter 116 is connected to transmit overflow (CARRY) and underflow (BORROW) signals to an up/down offset counter 118. The counter 118 is connected to supply the required offset value to the noninverting input terminal of op-amp 82 by means of a digital-to-analog (D/A) converter 120 coupled through the resistor 94.

Between zero-setting intervals, the last offset value developed by the combined auto-zero loop 104 of FIG. 8 remains stored in the up/down offset counter 118 and is supplied to the op-amp 82 through the D/A converter 120. During the auto-zero interval, a zero input signal is applied to the circuit 60 by closing switch 86 (FIG. 7). Ideally, the output of the A/D converter 16 should be a digital value of exactly zero for a non-offset unipolar converter with zero analog volts applied to it. However, all real systems, even if they are perfectly offset corrected, will produce some non-zero readings because of the inherent electronic noise in analog electronics. With the normal uncorrelated noise there should be as many negative as positive values. Furthermore, since negative values will show up as digital values of zero for a non-offset unipolar converter, a digital zero detector 108 is normally sufficient to detect zero and negative values. For other types of converters, the most significant or sign bit can be used to detect the sign of the offset. The output of the zero or sign detect circuit 108 is used to pulse either up or down the averaging circuit 116. A net or average offset will, over sufficient conversions, cause the averaging counter 116 to overflow (CARRY) or underflow (BORROW). Every time overflow or underflow occurs, it will cause the up/down offset counter 118 to increment or decrement, respectively, thereby correcting the overall combined circuitry 60 and 28 for any offset error.

As is evident from the foregoing, the invention provides an improved data converter for a CT data acquisition system that utilizes a progammable gain amplifier having a switchable resistor attenuator stage followed by a fixed gain amplifier stage to provide significant advantages over conventional data converters using prior art programmable gain amplifiers. Amplifier settling time is independent of gain selection, available gain selections can be readily modified or expanded, and auto-zero offset voltage correction circuitry can be easily implemented. Those skilled in the art will appreciate that the preferred embodiments of the invention described above are just examples of how the invention can be implemented, and that various substitutions and modifications may be made therein without departing from the spirit and scope of the invention as defined by the claims below.

What is claimed is:

1. Data converter circuitry for a radiation imaging data acquisition system, comprising:

a programmable gain amplifier circuit having a resistor attenuator stage and a fixed gain amplifier stage, the resistor attenuator stage providing a plurality of paths connecting the input of the programmable gain amplifier circuit with the input of the fixed gain amplifier stage, and switch means responsive to a signal received at the input of said data converter circuitry to select one of said paths for communication of said signal to said fixed gain amplifier stage, thereby selecting the gain to be provided by said programmable gain amplifier to said signal; and means for periodically setting the input of said fixed gain amplifier stage to ground, as auto-zeroing circuit for determining the differential input voltage that must be applied across the fixed gain amplifier stage to make its output voltage zero when said output of said fixed gain amplifier stage is set to ground, and means for applying said determined differential input voltage to said fixed gain amplifier stage as correction to the input offset voltage when said input of said fixed gain amplifier stage is not set to ground.

2. Circuitry as in claim 1, wherein said plurality of paths comprises a plurality of voltage divider paths at the input of said data converter circuitry to selectively divide the voltage of an analog input signal prior to communication of said signal to said fixed gain amplifier stage, each of said paths comprising at least two resistors serially connected between the input of said data converter circuitry and ground, and wherein said switch means comprises a plurality of switches, one switch connecting the junction between the two resistors of each path to the input of said fixed gain amplifier stage.

3. Circuitry as in claim 2, wherein the fixed gain amplifier stage comprises a plurality of serially connected operational amplifiers.

4. Circuitry as in claim 1, wherein said fixed gain amplifier stage comprises first and second serially connected operational amplifiers, wherein said ground connecting means comprises means for periodically setting the input of said first operational amplifier to ground, and wherein said voltage applying means comprises means for applying said differential input voltage to said second operational amplifier.

5. Circuitry as in claim 4 wherein said auto-zeroing circuit comprises a third operational amplifier, and means for periodically connecting said third operational amplifier in integrator configuration between output and input terminals of said second operational amplifier, and wherein said voltage applying means comprises a capacitor connected to an input terminal of said second operational amplifier.

6. Circuitry as in claim 1, further comprising an analog-to-digital converter connected at the output of said fixed gain amplified stage, means for periodically setting the input of said fixed gain amplifier stage to ground, an auto-zeroing circuit for determining the differential input voltage that must be applied across the fixed gain amplifier stage to make the output of said analog-to-digital converter zero when said input of said fixed gain amplifier stage is set to ground, and means for applying said differential input voltage to said fixed amplifier stage as a correction to the input offset voltage when said input of said fixed gain amplifier stage is not set to ground.

7. Circuitry as in claim 6, wherein said fixed gain amplifier stage comprises first and second serially connected operational amplifiers, wherein said ground connecting means comprises means for periodically connecting the input of said first operational amplifier to ground, and wherein said voltage applying means comprises means for applying said differential input voltage to said second operational amplifier.

8. Circuitry as in claim 7, wherein said auto-zeroing circuit comprises a digital detect logic circuit, an up/down averaging counter, an up/down offset counter and a digital-to-analog converter, all serially connected between the output of said analog-to-digital converter and an input of said second operational amplifier.

9. In a radiation imaging data acquisition system having a front-end signal conditioner to convert relatively low level analog signals from radiation into low impedance signals; an analog signal multiplexer for supplying said low impedance signals from different detector channels along a common channel; a data converter including a programmable gain amplifier for amplifying said common channel signals by a gain selected as a function of the magnitude of the signals and an analog-to-digital converter for transforming said amplified signals into corresponding digital signals; a digital control for correlating said digital signals with the detectors from which they came; the improvement comprising:

the programmable gain amplifier circuit having a resistor attenuator stage and a fixed gain amplifier stage, the resistor attenuator stage providing a plurality of paths connecting the input of the programmable gain amplifier with the input of the fixed gain amplifier stage, and switch means responsive to a signal received at the input of the said data converter circuitry to select one of the said paths for communication of said signal to said fixed gain amplifier stage, thereby selecting the gain to be provided by said programmable gain amplifier to said signal; and means for periodically setting the input of said fixed gain amplifier stage to ground, an auto-zeroing circuit for determining the differential input voltage that must be applied across the fixed gain amplifier stage to make its output voltage zero when said input of said fixed gain amplifier stage is set to ground, and means for applying said determined differential input voltage to said fixed gain amplifier stage as a correction to the input offset voltage when said input of said fixed gain amplifier stage is not set to ground.

10. An improvement as in claim 9, wherein said plurality of paths comprises a plurality of voltage divider paths at the input of said data converter circuitry to selectively divide the voltage of an analog input signal prior to communication of said signal to said fixed gain amplifier, each of said paths comprising at least two resistors serially connected between the input of said data converter circuitry and ground, and wherein said switch means comprises a plurality of switches, one switch connecting the junction between the two resistors of each path to the input of said fixed gain amplifier stage.

11. An improvement as in claim 10, further comprising the analog-to-digital converter being connected at the output of said fixed gain amplified stage, means for periodically setting the input of said fixed gain amplifier stage to ground, an auto-zeroing circuit for determining the differential input voltage that must be applied across the fixed gain amplifier stage to make the output of said analog-to-digital converter zero when said input of said fixed gain amplifier stage is set to ground, and means for applying said determined differential input voltage to said fixed amplifier stage as a correction to the input offset voltage when said input of said fixed gain amplifier stage is not set to ground.

12. An improvement as in claim 11, wherein said auto-zeroing circuit comprises a digital detect logic circuit, an up/down averaging counter, an up/down offset counter and a digital-to-analog converter, all serially connected between the output of said analog-to-digital converter and said fixed amplifier stage.

13. A radiation imaging data acquisition system, comprising:

a plurality of dedicated front-end signal conditioning circuits connected to receive respective analog output signals from a plurality of radiation detectors;

data converter circuitry connected to receive the conditioned analog output signals from said dedicated front-end signal conditioning circuits to amplify them by a gain selected as a function of the magnitude of the detector output signals and to convert them from analog to digital form;

said data converter circuitry comprising a programmable gain amplifier circuit having a resistor attenuator stage and a fixed gain amplifier stage, the resistor attenuator stage providing a plurality of paths connecting the input of the programmable gain amplifier with the input of the fixed gain amplifier stage, and switch means responsive to the magnitude of the detector output signals to select one of the said paths for communication of said conditioned signals to said fixed gain amplifier stage, thereby selecting the gain to be provided by said programmable gain amplifier to said signals; and said fixed gain amplifier stage comprising at least first and second serially connected amplifiers and means for periodically setting an input of said first operational amplifier to ground, and wherein said data converter circuitry further comprises an analog-to-digital converter connected to the output of said second operational amplifier, an auto-zeroing circuit for determining the differential input voltage that must be applied across the fixed gain amplifier stage to make the output of said analog-to-digital converter zero when said input of said fixed gain amplifier stage is set to ground, and means for applying said second operational amplifier as a correction to the input offset voltage when said input of said first operational amplifier stage is not set to ground.

14. A system as in claim 13, wherein each of said paths comprises two resistors serially connected between the input of said data converter circuitry and ground, and wherein said switch means comprises a plurality of switches, one switch connecting the junction between the two resistors of each path to the input of said fixed gain amplifier stage.

15. A system as in claim 14, wherein said auto-zeroing circuit comprises a digital detect logic circuit, an up/down averaging counter, an up/down offset counter and a digital-to-analog converter, all serially connected between the output of said analog-to-digital converter and said fixed amplifier stage.

* * * * *

UNITED STATES PATENT AND TRADEMARK OFFICE
CERTIFICATE OF CORRECTION

PATENT NO. : 4,815,118
DATED : Mar. 21, 1989
INVENTOR(S) : Kishore C. Acharya and Paul C. Schanen It is certified that error appears in the above-identified patent and that said Letters Patent is hereby corrected as shown below:

Col. 8, line 32, change "output" to --input--.

Signed and Sealed this

Twenty-seventh Day of November, 1990

Attest:

HARRY F. MANBECK, JR.

*Attesting Officer*   *Commissioner of Patents and Trademarks*